(12) United States Patent
Hukkanen (10) Patent No.: US 10,165,676 B2
(45) Date of Patent: Dec. 25, 2018

(54) CIRCUIT BOARD SYSTEM (71) Applicant: LEDIL OY, Salo (FI)

(72) Inventor: Hannu Hukkanen, Turku (FI)

(73) Assignee: LEDIL OY, Salo (FI)

(*) Notice: Subject to any disclaimer, the term of this patent is extended or adjusted under 35 U.S.C. 154(b) by 0 days.

(21) Appl. No.: 15/510,284

(22) PCT Filed: Sep. 3, 2015

(86) PCT No.: PCT/FI2015/050575
§ 371 (c)(1),
(2) Date: Mar. 10, 2017

(87) PCT Pub. No.: WO2016/038245
PCT Pub. Date: Mar. 17, 2016

(65) Prior Publication Data
US 2017/0257943 A1 Sep. 7, 2017

(30) Foreign Application Priority Data
Sep. 12, 2014 (FI) ..................................... 20145804

(51) Int. Cl.
*H05K 1/14* (2006.01)
*H05K 1/02* (2006.01)
(Continued)

(52) U.S. Cl.
CPC ......... *H05K 1/0274* (2013.01); *G02B 6/3502* (2013.01); *H05K 1/142* (2013.01);
(Continued)

(58) Field of Classification Search
CPC .... H05K 1/0274; H05K 1/142; H05K 3/0008; G02B 6/3502
(Continued)

(56) References Cited

U.S. PATENT DOCUMENTS

| 4,631,819 A | 12/1986 | Lasier et al. |
| 5,068,771 A * | 11/1991 | Savage, Jr. ............... F21S 8/00 |
| | | 362/255 |

(Continued)

FOREIGN PATENT DOCUMENTS

| DE | 37 18 546 A1 | 12/1987 |
| DE | 10 2010 043 220 A1 | 5/2012 |

(Continued)

OTHER PUBLICATIONS

International Search Report, dated Nov. 18, 2015, from corresponding PCT application.

(Continued)

*Primary Examiner* — Hung S Bui
(74) *Attorney, Agent, or Firm* — Young & Thompson (57) ABSTRACT

A circuit board system includes a circuit board having a base part (101) and at least one changeable part (102) furnished with at least one electrical component (103) such as a light emitting diode. The base part includes an aperture for receiving the changeable part so that a perpendicular of the changeable part is parallel with a perpendicular of the base part. The aperture is shaped to allow the position of the changeable part to be changed with respect to the base part when the changeable part is in the aperture, and edges of the aperture and the changeable part have mutually cooperative connection portions (105, 106) which allow the changeable part to be introduced on the aperture when the changeable part is in a first position and which limit freedom of the changeable part to get away from the aperture when the changeable part is in a second position.

13 Claims, 7 Drawing Sheets

(51) Int. Cl.
 *H05K 3/00* (2006.01)
 *G02B 6/35* (2006.01)
(52) U.S. Cl.
 CPC ......... *H05K 3/0008* (2013.01); *H05K 3/0052* (2013.01); *H05K 2201/09027* (2013.01); *H05K 2201/10106* (2013.01); *H05K 2201/209* (2013.01); *H05K 2203/167* (2013.01); *H05K 2203/176* (2013.01)
(58) Field of Classification Search
 USPC ......................................................... 361/736
 See application file for complete search history.

(56) References Cited

U.S. PATENT DOCUMENTS

| | | | |
|---|---|---|---|
| 6,012,210 | A | 1/2000 | Stadjuhar, Jr. et al. |
| 6,441,407 | B1 | 8/2002 | Gruning et al. |
| 6,682,211 | B2 * | 1/2004 | English ............... B60Q 1/2696 362/545 |
| 7,766,499 | B2 * | 8/2010 | Park ................... F21V 19/0025 361/760 |
| 2006/0082985 | A1 | 4/2006 | Naruse |
| 2006/0215411 | A1 | 9/2006 | Lin |
| 2011/0271522 | A1 | 11/2011 | Still et al. |
| 2012/0002427 | A1 | 1/2012 | Moon et al. |

FOREIGN PATENT DOCUMENTS

| | | |
|---|---|---|
| DE | 20 2011 101 663 U1 | 8/2012 |
| FR | 2 547 089 A2 | 12/1984 |
| JP | H02-251198 A | 10/1990 |
| JP | H04-229551 A | 8/1992 |

OTHER PUBLICATIONS

Finnish Search Report, dated Apr. 23, 2015, from corresponding Finnish application.

* cited by examiner

CIRCUIT BOARD SYSTEM

FIELD OF THE INVENTION

The invention relates generally to electrical devices comprising a circuit board furnished with electrical components which may comprise, for example but not necessarily, a light source such as a light emitting diode "LED" and a driver for supplying electrical power to the light source. More particularly, the invention relates to a circuit board system where one or more of electrical components are non-destructively changeable. Furthermore, the invention relates to a method for fabricating a circuit board system.

BACKGROUND

In many cases, one or more electrical components and/or electrical systems furnished on a circuit board are wanted to be non-destructively changeable so that changing the electrical component or system under consideration does not require destructive actions such as e.g. detaching soldered joints. A changeable electrical component can be for example a light source such as a light emitting diode "LED", a filament lamp, or a gas-discharge lamp. For another example, a changeable electrical component can be an integrated circuit such as e.g. a memory circuit. A light source can be wanted to be changeable in order to be able to use light sources having different colors and/or other properties, and a memory circuit can be wanted to be changeable in order to be able to use memory circuits which contain different control data so as to modify the operation of an electrical device comprising the circuit board. A changeable electrical system may comprise for example a light source and a driver circuit for supplying electrical power to the light source.

A known approach to provide non-destructively changeable electrical components is to use one or more socket elements whose connector pins are soldered or otherwise attached to electrical conductors of a circuit board. Each socket element comprises sections for receiving connector pins of a changeable electrical component. In typical cases, the connector pins of the changeable electrical component adhere to electrical conductors of the socket element with the aid of spring forces and/or friction. The above-described approach is, however, not free from challenges. One of the challenges is that the socket elements require room in the direction perpendicular to the circuit board and thus the size of the circuit board system gets increased. Another challenge is that each socket element is suitable for only such changeable electrical components whose connector pin pattern is suitable for the socket element under consideration.

SUMMARY

The following presents a simplified summary in order to provide a basic understanding of some aspects of various embodiments of the invention. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new circuit board system which comprises one or more non-destructively changeable electrical components and/or one or more non-destructively changeable electrical systems each constituted by many electrical components. A circuit board system according to the invention comprises:
- a circuit board comprising a base part and at least one changeable part, the base part and the changeable part being separate pieces, and
- at least one electrical component mounted on the changeable part.

The base part comprises an aperture for receiving the changeable part so that a perpendicular of the changeable part is parallel with a perpendicular of the base part. The aperture is shaped to allow the position of the changeable part to be changed with respect to the base part when the changeable part is in the aperture so that the perpendicular of the changeable part is parallel with the perpendicular of the base part. The edges of the aperture and the edges of the changeable part are shaped to form mutually cooperative connection portions which allow the changeable part to be introduced on the aperture when the changeable part is in a first position with respect to the base part and which mechanically limit the freedom of the changeable part to get away from the aperture when the changeable part is in a second position with respect to the base part. The circuit board system further comprises a locking element that is a separate piece with respect to the base part and the changeable part, the locking element having connection portions shaped to constitute, together with the connection portions of the changeable part, combined connection portions for shape-locking the combination of the changeable part and the locking element with respect to the base part when the changeable part is in the second position with respect to the base part.

As each non-destructively changeable electrical component and/or electrical system is implemented with the aid of the changeable part which match the corresponding aperture of the base part, the implementation of the changeable electrical component and/or system does not require so much room in the direction perpendicular to the circuit board as is the case when using a traditional socket element. Furthermore, different ones of the changeable electrical components and/or systems have their own changeable parts of the circuit board and thus there is no limitations concerning the connector pin patterns of the changeable electrical components.

In accordance with the invention, there is provided also a new method for fabricating a circuit board system according to the invention. The method comprises:
- fabricating the circuit board comprising the base part and the at least one changeable part so that the circuit board comprises one or more isthmuses connecting the base part and the changeable part to each other,
- mounting at least one electrical component on the changeable part, and subsequently
- breaking the one or more isthmuses so as to mechanically detach the changeable part from the base part.

The advantage of the above-defined method is that the circuit board which comprises the base part and the at least one changeable part can be a single piece when it is furnished with electrical components.

A number of exemplifying and non-limiting embodiments of the invention are described in accompanied dependent claims.

Various exemplifying and non-limiting embodiments of the invention both as to constructions and to methods of operation, together with additional objects and advantages thereof, will be best understood from the following description of specific exemplifying embodiments when read in connection with the accompanying drawings.

The verbs "to comprise" and "to include" are used in this document as open limitations that neither exclude nor require the existence of also un-recited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE FIGURES

Exemplifying and non-limiting embodiments of the invention and their advantages are explained in greater detail below with reference to the accompanying drawings, in which.

DESCRIPTION OF EXEMPLIFYING EMBODIMENTS

Figure 1A:
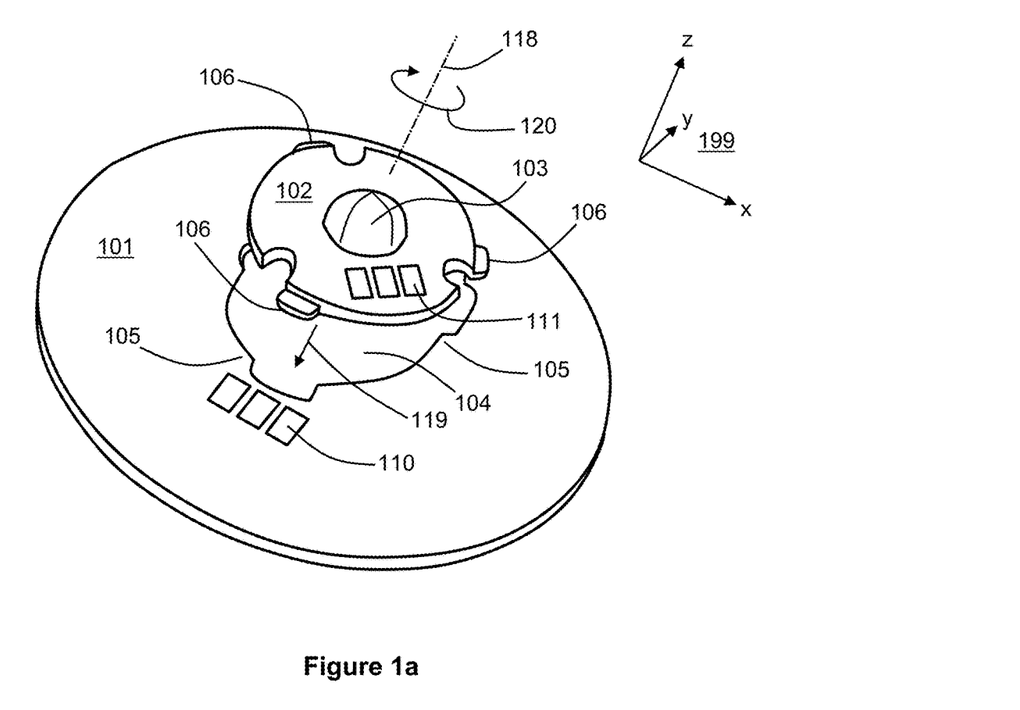
FIGS. 1a, 1b, 1c, 1d and 1e illustrate a circuit board system according to an exemplifying and non-limiting embodiment of the invention.

FIG. 1a illustrates a circuit board system according to an exemplifying and non-limiting embodiment of the invention. The circuit board system comprises a circuit board that comprises a base part 101 and a changeable part 102. The changeable part 102 comprises an electrical component 103 which can be for example a light source such as a light emitting diode "LED", a filament lamp, or a gas-discharge lamp. The base part 101 comprises an aperture 104 for receiving the changeable part 102 so that the perpendicular of the changeable part is parallel with the perpendicular of the base part. In the exemplifying situation shown in FIG. 1a, the perpendicular of the base part and the perpendicular of the changeable part are parallel with the z-axis of a coordinate system 199. The aperture 104 receives the changeable part 102 when the changeable part is moved in the negative z-direction according to an arrow 119 shown in FIG. 1a. The aperture 104 is shaped to allow the position of the changeable part 102 to be changed with respect to the base part 101 when the changeable part is in the aperture so that the perpendicular of the changeable part is parallel with the perpendicular of the base part. In the exemplifying circuit board system illustrated in FIG. 1a, the aperture 104 is shaped to allow the changeable part 102 to be rotated with respect to a rotation axis 118 when the changeable part 102 is in the aperture 104 so that the perpendicular of the changeable part is parallel with the perpendicular of the base part 101. In the exemplifying situation shown in FIG. 1a, the rotation axis 118 is parallel with the z-axis of the coordinate system 199.

Figure 1B:
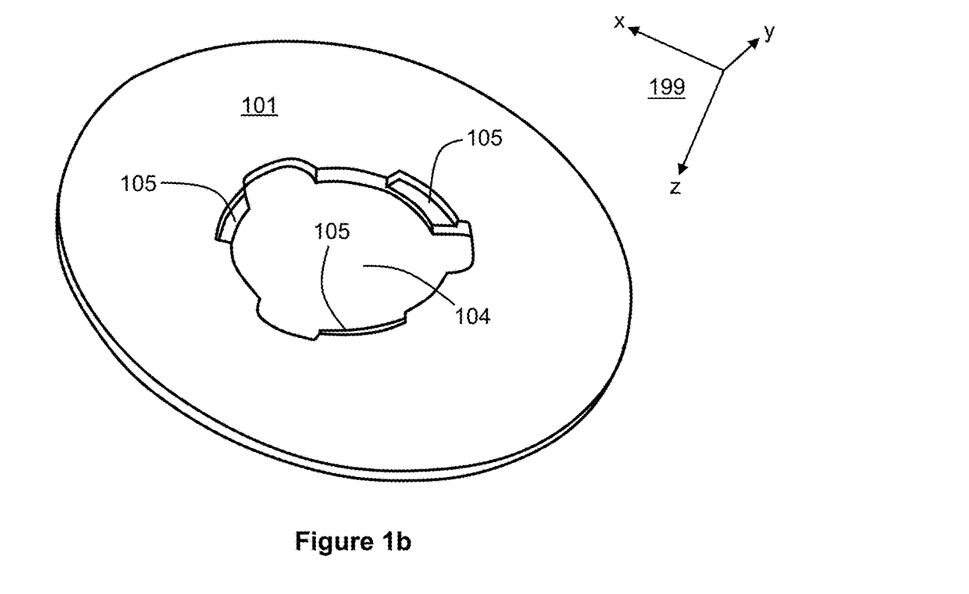

The changeable part 102 comprises connection portions 106 which are cooperative with corresponding connection portions 105 of the base part 101. The connection portions 105 of the base part are located on the edges of the aperture 104 as illustrated in FIGS. 1a and 1b, where FIG. 1b shows the base part 101 from an opposite direction with respect to the view shown in FIG. 1a. The connection portions 105 of the base part 101 and the connection portions 106 of the changeable part 102 allow the changeable part 102 to be introduced on the aperture 104 when the changeable part is in a first position with respect to the base part. In this exemplifying case, the connection portions 106 of the changeable part 102 are cantilevers and the base part 101 is shaped so that the aperture 104 comprises portions corresponding to the cantilevers so as to allow the changeable part to be introduced on the aperture when the changeable part is in the above-mentioned first position where the cantilevers are aligned with the corresponding portions of the aperture. In this exemplifying case, the first position is the rotational position shown in FIG. 1a. As can be seen, the connection portions 106 are aligned with corresponding portions of the aperture 104 so that the changeable part can be moved into the aperture. The connection portions 105 of the base part 101 and the connection portions 106 of the changeable part 102 mechanically limit the freedom of the changeable part to get away from the aperture when the changeable part is in a second position with respect to the base part. After the changeable part 102 has been moved into the aperture 104, the changeable part 102 can be moved from the above-mentioned first position to the above-mentioned second position by rotating the changeable part 102 according to an arrow 120, i.e. clockwise in FIG. 1a, so that the connection portions 106, i.e. the cantilevers, get overlapped with the connection portions 105.

As can be seen from FIGS. 1a and 1b, the connection portions 105 of the base part 101 and the connection portions 106 of the changeable part 102 are capable of limiting the freedom of the changeable part to get away from the aperture 104 in the positive z-direction but not in the negative z-direction. Thus, the connection portions illustrated in FIGS. 1a and 1b are not sufficient to shape-lock the changeable part 102 with respect to the base part 101. Shape-locking can be made possible for example by attaching, to the surface of the base part 101 shown in FIG. 1b, one or more plates or other support elements which cover the connection portions 105. In this case, the connection portions 106, i.e. the cantilevers, get between the connection portions 105 and the above-mentioned plates or other support elements when the changeable portion 102 is in the aperture 104 and the changeable portion is rotated according to the arrow 120. As illustrated with the aid of FIGS. 1c, 1d and 1e, the shape-locking can be made possible with the aid of a locking element 107 too. A perspective view of the locking element 107 is shown in FIG. 1e. The locking element 107 comprises connection portions 108. As can be seen from FIG. 1d, the connection portions 108 of the locking element 107 are shaped to constitute, together with the connection portions 106 of the changeable part 102, combined connection portions for shape locking the combination of the changeable part and the locking element with respect to the base part 101 when the changeable part and the locking element are, with respect to the base part, in the position shown in FIGS. 1c and 1d. The combination of the changeable part 102 and the locking element 107 can be released from the base part 101 by rotating the combination according to an arrow 121, i.e. clockwise in FIG. 1d.

Figure 1C:
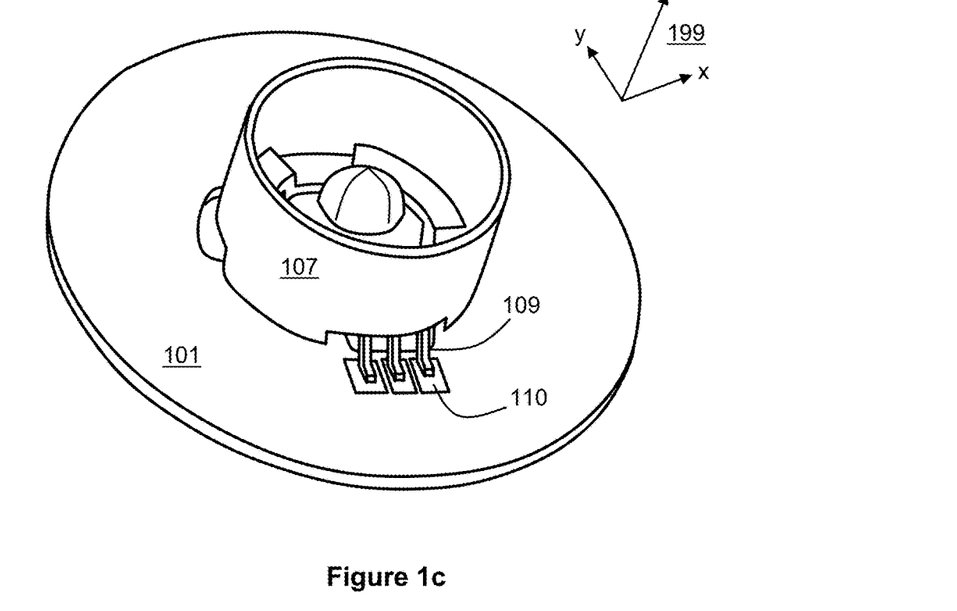
Figure 1D:
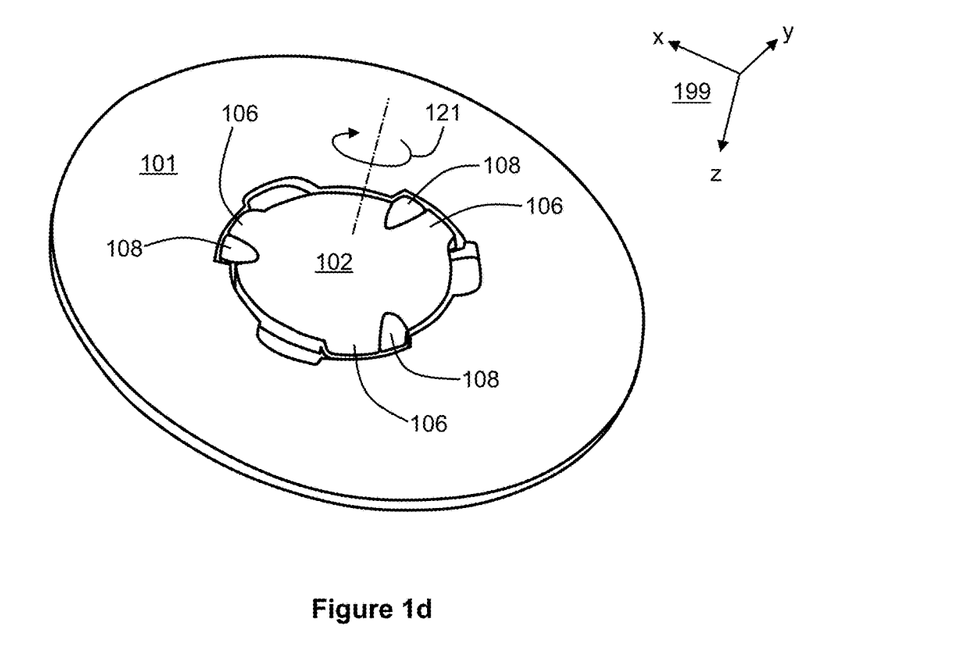
Figure 1E:
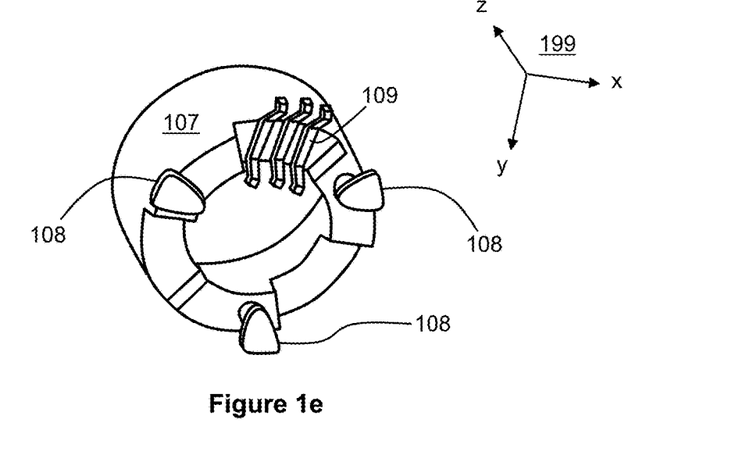

In the exemplifying circuit board system illustrated in FIGS. 1a-1e, the locking element 107 comprises flexible electrical conductors for forming galvanic contacts with connection pads of the base part 101 and with connection pads of the changeable part 102 when the changeable part and the locking element are, with respect to the base part, in the position shown in FIGS. 1c and 1d. In FIGS. 1c and 1e, one of the above-mentioned flexible electrical conductors of the locking element is denoted with a reference number 109. In FIGS. 1a and 1c, one of the above-mentioned connection pads of the base part 101 is denoted with a reference number 110. In FIG. 1a, one of the above-mentioned connection pads of the changeable part 102 is denoted with a reference number 111. The flexible electrical conductors of the locking element and the respective connection pads of the base part and of the changeable part provide electrical connections between the base part and the changeable part. It is also possible that the changeable part 102 is provided with electrical wires for transferring electrical power to the electrical component 103. The electrical wires can be connected to a suitable element of the base part 101 or to another device for supplying the electrical power. Furthermore, the changeable part 102 can be provided with electrical wires for transferring one or more control signals to the electrical component 103. The electrical wires are not shown in FIGS. 1a-1e. Furthermore, it is also possible that the changeable part 102 is provided with one or more electrical connector elements each adapted to receive a counterpart connected to electrical wires. For example, there can be many electrical components, e.g. LEDs having different colors, on the changeable part and each of the electrical connector elements can be connected to one of the electrical components. Thus, it is possible to select which one or ones of the electrical components is/are activated. The one or more electrical connector elements are not shown in FIGS. 1a-1e.

Figure 2:
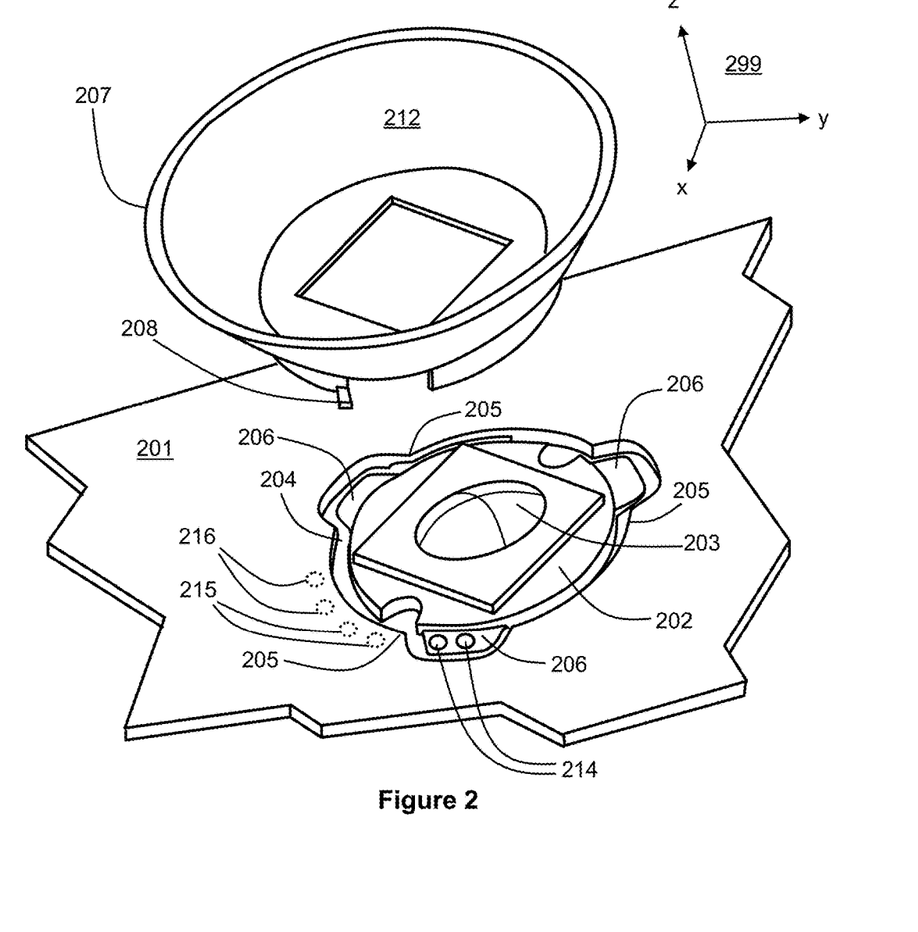
FIG. 2 illustrates a circuit board system according to an exemplifying and non-limiting embodiment of the invention.

FIG. 2 illustrates a circuit board system according to an exemplifying and non-limiting embodiment of the invention. The circuit board system comprises a circuit board that comprises a base part 201 and one or more changeable parts. FIG. 2 shows a portion of the base part 201 and the changeable part 202. It is worth noting that the circuit board system may further comprise one or more other changeable parts which are not shown in FIG. 2. The circuit board system comprises an electrical component 203, e.g. a LED, mounted on the changeable part 202. Furthermore, the circuit board system may comprise an electrical component or an electrical system, e.g. a driver for supplying the LED, mounted on the other side of the changeable part 202, and/or electrical components and/or electrical systems mounted on the base part 201. The base part comprises an aperture 204 for receiving the changeable part 202 so that a perpendicular of the changeable part is parallel with a perpendicular of the base part. In the exemplifying situation shown in FIG. 2, the perpendicular of the base part and the perpendicular of the changeable part are parallel with the z-axis of a coordinate system 299. The aperture is shaped to allow the position of the changeable part 202 to be changed with respect to the base part when the changeable part is in the aperture so that the perpendicular of the changeable part is parallel with the perpendicular of the base part. The edges of the aperture and the edges of the changeable part are shaped to form mutually cooperative connection portions 205 and 206 which allow the changeable part to be introduced on the aperture when the changeable part is in a first position with respect to the base part and which mechanically limit the freedom of the changeable part to get away from the aperture when the changeable part is in a second position with respect to the base part. In this exemplifying case, the aperture 204 is shaped to allow the changeable part 202 to be rotated with respect to a rotation axis parallel with the perpendicular of the changeable part when the changeable part is in the aperture so that the perpendicular of the changeable part is parallel with the perpendicular of the base part. The circuit board system further comprises a locking element 207 having connection portions shaped to constitute, together with the connection portions 206 of the changeable part, combined connection portions for shape-locking the combination of the changeable part and the locking element with respect to the base part when the changeable part is in the above-mentioned second position with respect to the base part. In FIG. 2, one of the connection portions of the locking element 207 is denoted with a reference number 208. In a case where the electrical component 203 is a light source, e.g. a LED, the locking element 207 is advantageously an optical device for modifying the distribution pattern of the light emitted by the light source. The optical device may comprise for example a reflector portion and/or a lens portion for modifying the light distribution pattern. For example, a surface 212 of the locking element 207 can be reflective. Furthermore, the light egress opening of the locking element 207 can be provided with a lens or with a light dispersing element having roughened or undulating surface for smoothing the light distribution pattern.

In the exemplifying circuit board system illustrated in FIG. 2, one of the connection portions 106 of the changeable part 202 comprises connection pads 214 and one of the connection portions of the base part 201 comprises contact elements 215 for forming galvanic contacts with the connection pads when the changeable part 202 is in the second position where the combination of the locking element 207 and the changeable part 202 is shape-locked with respect to the base part 201. The contact elements 215 are depicted with dashed lines in FIG. 2 because the contact elements 215 are on the opposite side of the base part 201 with respect to the view shown in FIG. 2. The contact elements 215 may comprise for example flexible metal strips for directing spring forces against the connection pads 214 so as to provide reliable galvanic contacts. The connections portions 205 of the base part can be shaped so that the combination of the locking element 207 and the changeable part 202 is shape-locked with respect to the base part 201 also when the changeable part is in a third position with respect to the base part. In this case, the third position is advantageously such that there are no contacts between the connection pads 214 and the contact elements 215. Thus, the third position can be a position in which the combination of the locking element 207 and the changeable part 202 is shape-locked with respect to the base part 201 but there are no electrical connections from contact elements 215 to the electrical component 203. It is also possible that the base part comprises other contact elements 216 for forming galvanic contacts with the connection pads 214 when the changeable part 202 is in the above-mentioned third position. The contact elements 216 are shown with dashed lines in FIG. 2 because the contact elements 216 are on the opposite side of the base part 201 with respect to the view shown in FIG. 2. Thus, the rotational position of the changeable part 202 with respect to the base part 201 can be used for selecting desired electrical connections. It is also possible that the locking element 207 is provided with electrical wires and with contact means cooperating with corresponding contact means of the changeable part 202. The electrical wires, the contact means, and the corresponding contact means of the changeable part 202 are not shown in FIG. 2. Furthermore, it is also possible that the locking element 207 is provided with one or more electrical connector elements each adapted to receive a counterpart connected to electrical wires. The one or more electrical connector elements are not shown in FIG. 2.

Figure 3A:
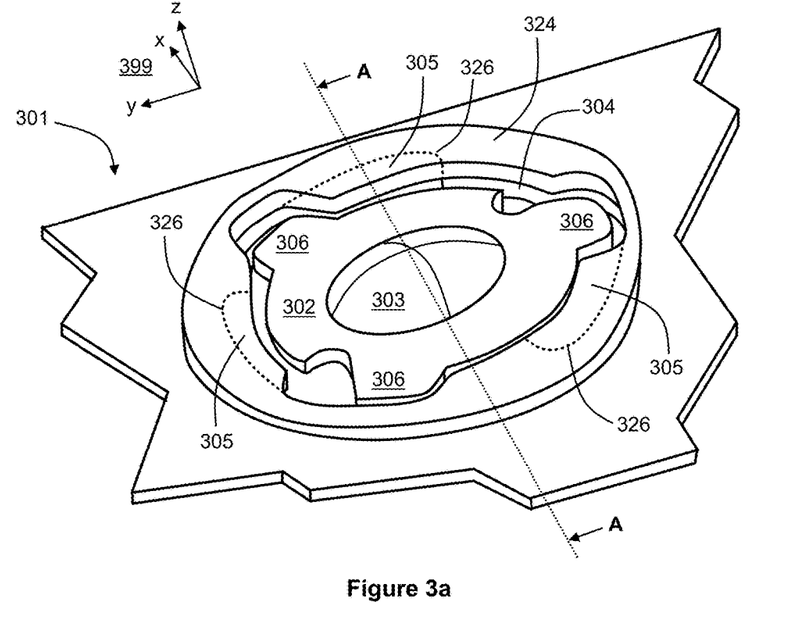
FIGS. 3a and 3b illustrate a circuit board system according to an exemplifying and non-limiting embodiment of the invention.
Figure 3B:
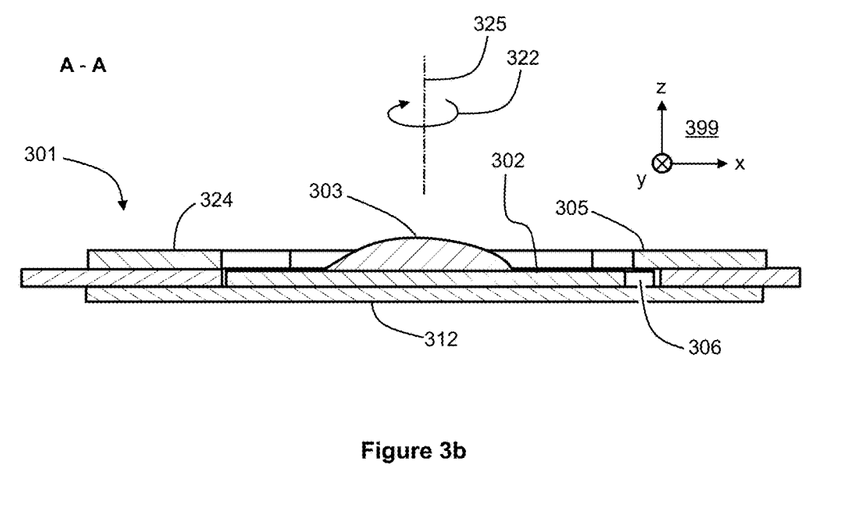

FIG. 3a illustrates a circuit board system according to an exemplifying and non-limiting embodiment of the invention. FIG. 3b shows a view of a section taken along a line A-A shown in FIG. 3a. The section plane is parallel with the xz-plane of a coordinate system 399. The circuit board system comprises a circuit board that comprises a base part 301 and at least one changeable part 302. The circuit board system comprises at least one electrical component 303 mounted on the changeable part. The base part comprises an aperture 304 for receiving the changeable part so that the perpendicular of the changeable part is parallel with the perpendicular of the base part. The aperture is shaped to allow the changeable part 302 to be rotated with respect to the base part around a rotational axis 325 when the changeable part is in the aperture of the base part so that the perpendicular of the changeable part is parallel with the perpendicular of the base part. The edges of the aperture and the edges of the changeable part are shaped to form mutually cooperative connection portions 305 and 306 which allow the changeable part 302 to be introduced on the aperture when the changeable part is in a first rotational position with respect to the base part and which mechanically limit the freedom of the changeable part to get away from the aperture when the changeable part is in a second rotational position with respect to the base part. In this exemplifying case, the base part 301 comprises a rim element 324 whose aperture is shaped to receive the changeable part 302 when the changeable part is in the first rotational position with respect to the base part. The portions of the aperture which are obscured by the rim element 324 in the view shown in FIG. 3 are illustrated with dashed lines 326. As can be seen from the dashed lines 326, the aperture allows the changeable part 302 to be rotated with respect to the base part 301 around the rotational axis 325. In this exemplifying case, the circuit board system further comprises a plate 312 which, together with the rim element 324, shape-locks the changeable part 302 with respect to the base part 301 after the changeable part 302 has been rotated according to an arrow 322 shown in FIG. 3b. Instead of the plate 312, it is also possible to use a locking element in a similar way as illustrated with FIGS. 1c-1e and 2 in order to achieve the shape-locking.

Figure 4:
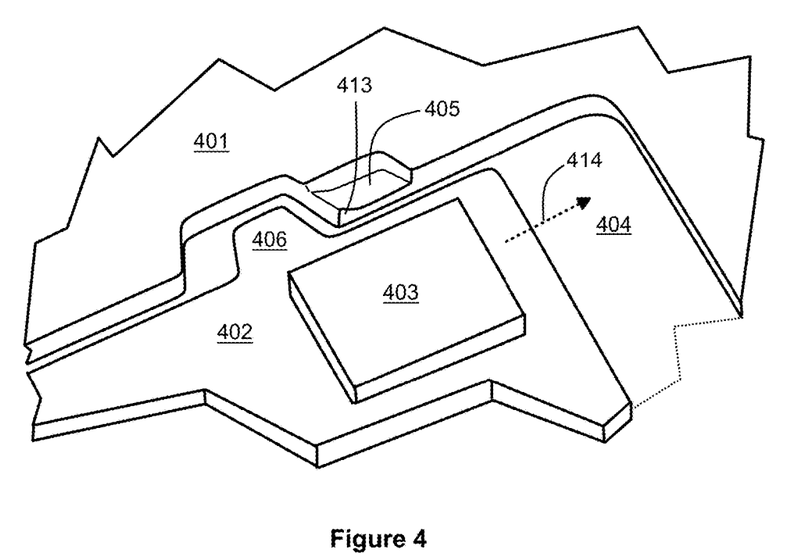
FIG. 4 illustrates a detail of a circuit board system according to an exemplifying and non-limiting embodiment of the invention.

FIG. 4 illustrates a detail of a circuit board system according to an exemplifying and non-limiting embodiment of the invention. The circuit board system comprises a circuit board that comprises a base part 401 and at least one changeable part 402. The circuit board system comprises at least one electrical component 403 mounted on the changeable part. The base part comprises an aperture 404 for receiving the changeable part so that the perpendicular of the changeable part is parallel with the perpendicular of the base part. The aperture 404 is shaped to allow the changeable part 402 to be linearly translated in a direction parallel with the base part 401 when the changeable part is in the aperture so that the perpendicular of the changeable part is parallel with the perpendicular of the base part. The edges of the aperture and the edges of the changeable part are shaped to form mutually cooperative connection portions 405 and 406 which allow the changeable part 402 to be introduced on the aperture when the changeable part is in a first translational position with respect to the base part and which mechanically limit the freedom of the changeable part to get away from the aperture when the changeable part is in a second translational position with respect to the base part. The circuit board system may further comprise a plate or another support element, not shown, attached on the surface of the base part 401 so that the plate or the other support element covers the connection portion 405. The connection portion 405 together with the plate or the other element shape-locks the changeable part 402 with respect to the base part when the changeable par 402 has been moved according to an arrow 414 so that the connection portion 406 has been moved into a room between the connection portion 405 and the plate or the other support element. It is also possible to use a locking element in a similar way as illustrated with FIGS. 1c-1e and 2 in order to achieve the shape-locking. In the exemplifying case illustrated in FIG. 4, the connection portion 405 comprises a bulge 413 for keeping the changeable part in its position after the changeable part has been moved according to the arrow 414. Similar bulges can be used also in conjunction with the circuit board systems illustrated in FIGS. 1a-1e, 2, 3a, and 3b where the changeable part is rotated with respect to the base part.

Figure 5:
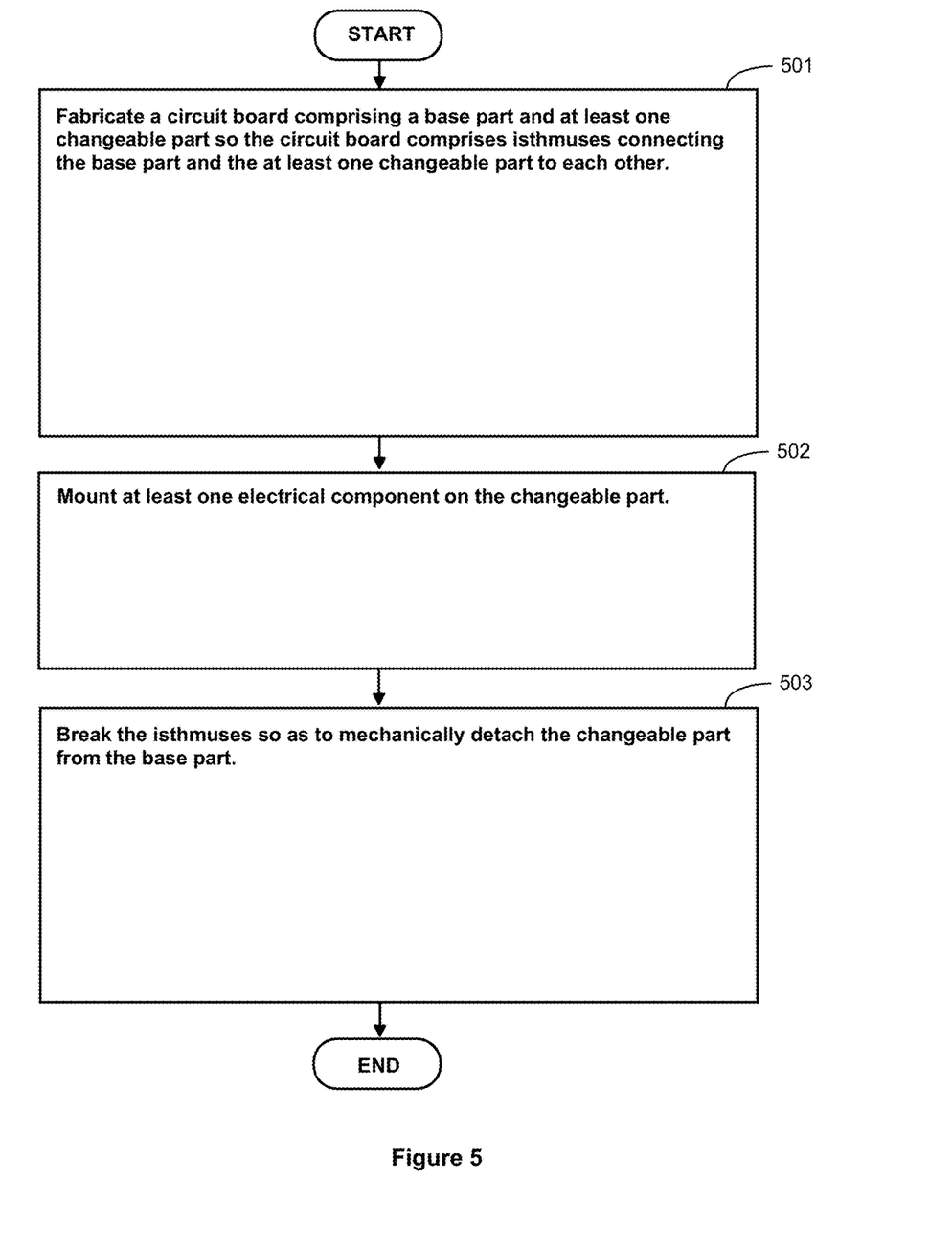
FIG. 5 shows a flowchart of a method according to an exemplifying and non-limiting embodiment of the invention for fabricating a circuit board system.

FIG. 5 shows a flowchart of a method according to an exemplifying and non-limiting embodiment of the invention for fabricating a circuit board system according to an embodiment of the invention. The method comprises the following actions:

action 501: fabricating the circuit board of the circuit board system so that the circuit board comprises one or more isthmuses connecting the base part and the at least one changeable part to each other, action 502: mounting at least one electrical component on the changeable part, and subsequently action 503: breaking the one or more isthmuses so as to mechanically detach the changeable part from the base part.

Figure 6:
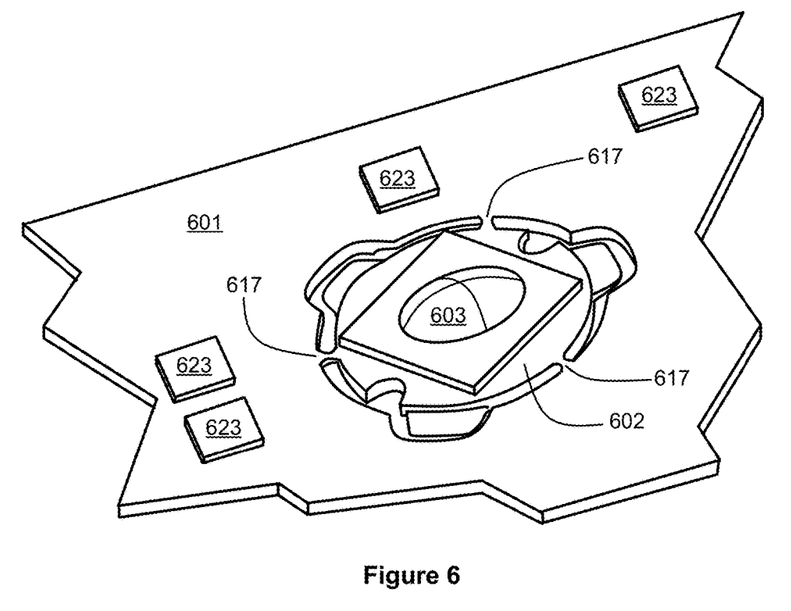
FIG. 6 illustrates a circuit board system according to an exemplifying and non-limiting embodiment of the invention at an exemplifying manufacturing stage.

FIG. 6 illustrates the circuit board system after the action 502 and prior to the action 503, i.e. the isthmuses are unbroken. In FIG. 6, the base part of the circuit board is denoted with a reference number 601, the changeable part with a reference number 602, the electrical component with a reference number 603, and the isthmuses with a reference number 617. The action 502 may further comprise mounting one or more electrical components 623 on the base part 601. The advantage of the method is that the circuit board which comprises the base part 601 and the one or more changeable parts 602 is a single piece when it is furnished with electrical components such as the electrical components 603 and 623.

In a circuit board system produced with the above-described method, the base part and the changeable part of the circuit board have the same thickness and are made of same one or more materials, because the base part and the changeable part are portions of the same circuit board.

Figure 7:
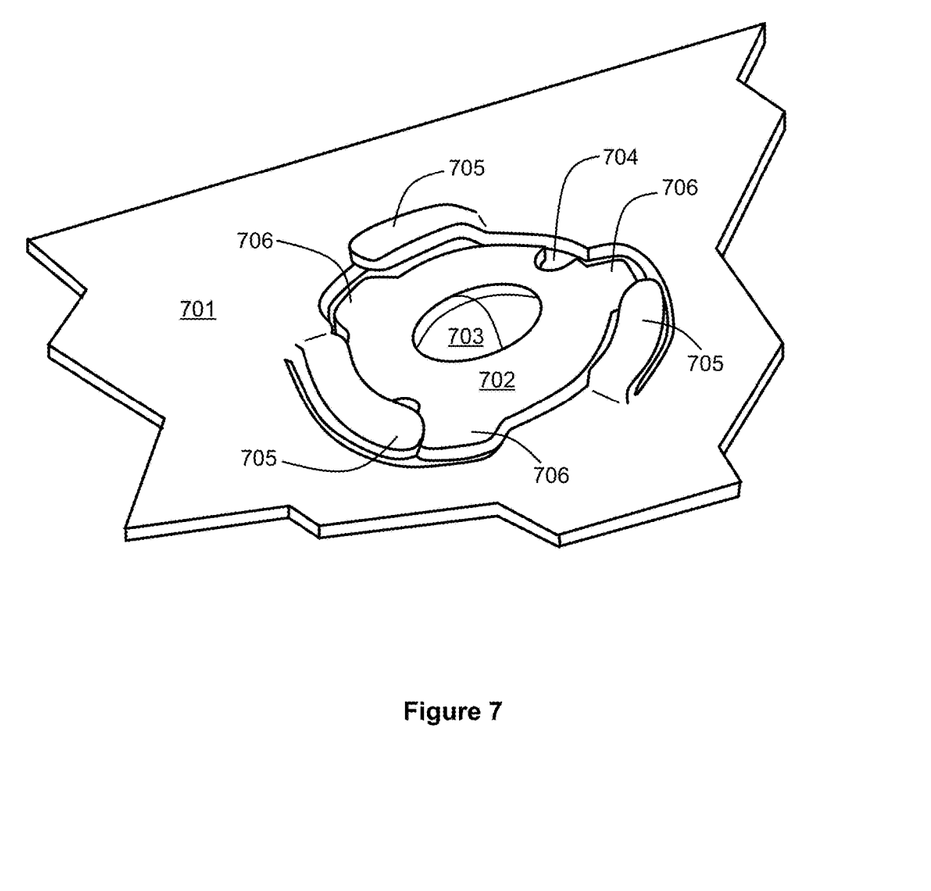
FIG. 7 illustrates a circuit board system according to an exemplifying and non-limiting embodiment of the invention.

FIG. 7 illustrates a circuit board system according to an exemplifying and non-limiting embodiment of the invention. The circuit board system comprises a circuit board that comprises a base part 701 and at least one changeable part 702. The circuit board system comprises at least one electrical component 703 mounted on the changeable part. The base part comprises an aperture 704 for receiving the changeable part so that the perpendicular of the changeable part is parallel with the perpendicular of the base part. The aperture is shaped to allow the changeable part 702 to be rotated with respect to the base part when the changeable part is in the aperture so that the perpendicular of the changeable part is parallel with the perpendicular of the base part. The edges of the aperture and the edges of the changeable part are shaped to form mutually cooperative connection portions 705 and 706 which allow the changeable part 702 to be introduced on the aperture when the changeable part is in a first rotational position with respect to the base part and which mechanically limit the freedom of the changeable part to get away from the aperture when the changeable part is in a second rotational position with respect to the base part. The base part 701 is shaped to form collets which represent the connection portions 705. In this exemplifying case illustrated in FIG. 7, the thickness of the changeable part 702 is uniform.

The specific examples provided in the description given above should not be construed as limiting the scope and/or the applicability of the appended claims. For example, it is not necessary that the changeable part of a circuit board comprises cantilevers and the base part comprises portions shaped to match the cantilevers. It is also possible that the base part comprises cantilevers and the changeable part comprises portions shaped to match the cantilevers.

What is claimed is:

1. A circuit board system comprising:
    a circuit board comprising
    a base part, and
    at least one changeable part,
    the base part and the changeable part being separate pieces;
    at least one electrical component mounted on a surface of the changeable part; and
    a locking element that is a separate piece with respect to the base part and the changeable part,
    wherein the base part comprises an aperture for receiving the changeable part so that a perpendicular of the surface of the changeable part is parallel with a perpendicular of a surface of the base part, the aperture being shaped to allow a position of the changeable part to be changed with respect to the base part when the changeable part is in the aperture so that the perpendicular of the surface of the changeable part is parallel with the perpendicular of the surface of the base part, edges of the aperture and edges of the changeable part being shaped to form mutually cooperative connection portions which allow the changeable part to be introduced on the aperture when the changeable part is in a first position with respect to the base part and which mechanically limit freedom of the changeable part to get away from the aperture when the changeable part is in a second position with respect to the base part, and
    wherein the locking element has connection portions shaped to constitute, together with the connection portions of the changeable part, combined connection portions for shape-locking the combination of the changeable part and the locking element with respect to the base part when the changeable part is in the second position with respect to the base part.

2. The circuit board system according to claim 1, wherein the aperture is shaped to allow the changeable part to be rotated with respect to a rotation axis parallel with the perpendicular of the surface of the changeable part when the changeable part is in the aperture so that the perpendicular of the surface of the changeable part is parallel with the perpendicular of the surface of the base part, the first position being a first rotational position of the changeable part with respect to the base part and the second position being a second rotational position of the changeable part with respect to the base part.

3. The circuit board system according to claim 1, wherein the aperture is shaped to allow the changeable part to be linearly translated in a direction parallel with the base part when the changeable part is in the aperture so that the perpendicular of the surface of the changeable part is parallel with the perpendicular of the surface of the base part, the first position being a first translational position of the changeable part with respect to the base part and the second position being a second translational position of the changeable part with respect to the base part.

4. The circuit board system according to claim 1, wherein the connection portions of the changeable part are cantilevers of the changeable part, and the base part is shaped so that the aperture comprises portions corresponding to the cantilevers to allow the changeable part to be introduced on the aperture when the changeable part is in the first position where the cantilevers are aligned with the corresponding portions of the aperture, and so that the cantilevers overlap with the connection portions of the base part when the changeable part is in the second position.

5. The circuit board system according to claim 1, wherein at least one of the connection portions of the changeable part comprises connection pads and at least one of the connection portions of the base part comprises contact elements configured to form galvanic contacts with the connection pads when the changeable part is in the second position.

6. The circuit board system according to claim 5, wherein the connections portions of the changeable part and the connections portions of the base part mechanically limit the freedom of the changeable part to get away from the aperture when the changeable part is in a third position with respect to the base part.

7. The board system according to claim 6, wherein the base part comprises other contact elements configured to form galvanic contacts with the connection pads when the changeable part is in the third position.

8. The circuit board system according to claim 1, wherein the locking element comprises flexible electrical conductors configured to form galvanic contacts with connection pads of the base part and with connection pads of the changeable part when the changeable part is in the second position with respect to the base part so as to provide electrical connections between the base part and the changeable part.

9. The circuit board system according to claim 1, wherein the at least one electrical component mounted on the changeable part comprises a light source.

10. The circuit board system according to claim 1, wherein the at least one electrical component mounted on the changeable part comprises a light source, and
    the locking element is an optical device configured to modify distribution pattern of light emitted by the light source.

11. The circuit board system according to claim 10, wherein the optical device comprises at least one of the following: a reflector portion and a lens portion.

12. The circuit board system according to claim 10, wherein the light source is a light emitting diode.

13. A method for fabricating a circuit board system, the method comprising:
    fabricating a circuit board comprising a base part and at least one changeable part so that the circuit board comprises one or more isthmuses connecting the base part and the changeable part to each other;
    providing a locking element that is a separate piece with respect to the base part and the changeable part;
    mounting at least one electrical component on the changeable part; and subsequently
    breaking the one or more isthmuses so as to mechanically detach the changeable part from the base part, wherein the base part comprises an aperture for receiving the changeable part so that a perpendicular of the surface of the changeable part is parallel with a perpendicular of a surface of the base part, the aperture being shaped to allow a position of the changeable part to be changed with respect to the base part when the changeable part is in the aperture so that the perpendicular of the surface of the changeable part is parallel with the perpendicular of the surface of the base part, and edges of the aperture and edges of the changeable part being shaped to form mutually cooperative connection portions which allow the changeable part to be introduced on the aperture when the changeable part is in a first position with respect to the base part and which mechanically limit freedom of the changeable part to get away from the aperture when the changeable part is in a second position with respect to the base part, and wherein the locking element has connection portions shaped to constitute, together with the connection portions of the changeable part, combined connection portions for shape-locking the combination of the changeable part and the locking element with respect to the base part when the changeable part is in the second position with respect to the base part.

* * * * *